(12) United States Patent
Koga et al.

(10) Patent No.: US 12,527,054 B2
(45) Date of Patent: Jan. 13, 2026

(54) SILICON WAFER AND EPITAXIAL SILICON WAFER

(71) Applicant: SUMCO CORPORATION, Tokyo (JP)

(72) Inventors: Kohtaroh Koga, Nagasaki (JP); Yasuhito Narushima, Nagasaki (JP); Naoya Nonaka, Tokyo (JP); Toshiaki Ono, Tokyo (JP); Masataka Hourai, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 405 days.

(21) Appl. No.: 17/853,469

(22) Filed: Jun. 29, 2022

(65) Prior Publication Data
US 2023/0133472 A1 May 4, 2023

(30) Foreign Application Priority Data

Nov. 4, 2021 (JP) .................. 2021-180296

(51) Int. Cl.
*H10D 62/60* (2025.01)
*C30B 15/04* (2006.01)
(Continued)

(52) U.S. Cl.
CPC ............ *H10D 62/60* (2025.01); *C30B 15/04* (2013.01); *C30B 25/186* (2013.01); *C30B 25/20* (2013.01);
(Continued)

(58) Field of Classification Search
CPC . H01L 29/36; H01L 29/167; H01L 21/02381; H01L 21/02532; H01L 21/02634; C30B 15/04; C30B 25/186; C30B 25/20; C30B 29/06; H10D 62/60; H10D 62/834
(Continued)

(56) References Cited

U.S. PATENT DOCUMENTS 6,261,362 B1 *  7/2001  Fujikawa ................ C30B 29/06
                                                                 117/19
6,491,752 B1   12/2002  Kirschi et al.
(Continued)

FOREIGN PATENT DOCUMENTS

CN   105026624 A   11/2015
CN   204792696 U   11/2015
(Continued)

OTHER PUBLICATIONS

Office Action issued in KR Patent Application No. 10-2022-0144498, Mar. 25, 2024, translation.
(Continued)

*Primary Examiner* — Tu-Tu V Ho
(74) *Attorney, Agent, or Firm* — GREENBLUM & BERNSTEIN P.L.C.

(57) ABSTRACT

A silicon wafer is provided in which a dopant is phosphorus, resistivity is from 0.5 mΩ·cm to 1.2 mΩ·cm, and carbon concentration is $3.0 \times 10^{16}$ atoms/cm$^3$ or more. The carbon concentration is decreased by 10% or more near a surface of the silicon wafer compared with a center-depth of the silicon wafer.

32 Claims, 7 Drawing Sheets

(51) Int. Cl.
*C30B 25/18* (2006.01)
*C30B 25/20* (2006.01)
*C30B 29/06* (2006.01)
*H01L 21/02* (2006.01)
*H10D 62/834* (2025.01)

(52) U.S. Cl.
CPC ........ *C30B 29/06* (2013.01); *H01L 21/02381* (2013.01); *H01L 21/02532* (2013.01); *H01L 21/02634* (2013.01); *H10D 62/834* (2025.01)

(58) Field of Classification Search
USPC .......................................... 257/607
See application file for complete search history.

(56) References Cited

U.S. PATENT DOCUMENTS

| | | | | |
|---|---|---|---|---|
| 6,843,847 | B1* | 1/2005 | Iida | C30B 15/203 257/E21.321 |
| 9,425,264 | B2 | 8/2016 | Kawashima et al. | |
| 9,755,022 | B2 | 9/2017 | Kawashima et al. | |
| 10,233,562 | B2 | 3/2019 | Narushima et al. | |
| 2005/0103256 | A1 | 5/2005 | Sadamitsu et al. | |
| 2005/0250349 | A1 | 11/2005 | Sadamitsu et al. | |
| 2007/0089666 | A1* | 4/2007 | Koike | C30B 15/00 117/20 |
| 2009/0114147 | A1* | 5/2009 | Cho | C30B 15/305 117/32 |
| 2009/0224367 | A1 | 9/2009 | Kurita et al. | |
| 2010/0193989 | A1* | 8/2010 | Stoddard | C30B 11/02 264/332 |
| 2013/0320429 | A1 | 12/2013 | Thomas | |
| 2014/0001605 | A1 | 1/2014 | Kawashima et al. | |
| 2016/0042974 | A1 | 2/2016 | Ono et al. | |
| 2016/0043178 | A1 | 2/2016 | Liu | |
| 2016/0126318 | A1 | 5/2016 | Sakurada | |
| 2018/0182641 | A1* | 6/2018 | Lee | C30B 33/005 |
| 2020/0141024 | A1 | 5/2020 | Maegawa et al. | |
| 2023/0132859 | A1 | 5/2023 | Koga et al. | |
| 2023/0295835 | A1 | 9/2023 | Maegawa et al. | |

FOREIGN PATENT DOCUMENTS

| | | |
|---|---|---|
| CN | 105164790 A | 12/2015 |
| CN | 105659367 A | 6/2016 |
| CN | 110730831 A | 1/2020 |
| CN | 110753764 A | 2/2020 |
| CN | 110799678 A | 2/2020 |
| JP | 2003-505324 A | 2/2003 |
| JP | 2007-045662 A | 2/2007 |
| JP | 2009-515370 A | 4/2009 |
| JP | 2010-087327 A | 4/2010 |
| JP | 2010-126401 A | 6/2010 |
| JP | 2013-168415 A | 8/2013 |
| JP | 2014-011293 A | 1/2014 |
| JP | 2014-199253 A | 10/2014 |
| JP | 2016-213232 A | 12/2016 |
| JP | 2018-058710 A | 4/2018 |
| JP | 2019-142733 A | 8/2019 |
| JP | 2020-155679 A | 9/2020 |
| JP | 2021-130577 A | 9/2021 |
| JP | 2021-130578 A | 9/2021 |
| JP | 2021-130579 A | 9/2021 |
| JP | 2023-070066 A | 5/2023 |
| JP | 2023-070067 A | 5/2023 |
| KR | 10-2005-035862 A | 4/2005 |
| KR | 10-2016-006692 A | 1/2016 |
| KR | 10-1837454 B1 | 3/2018 |
| KR | 10-2018-0037454 A | 4/2018 |
| KR | 10-2019-126163 A | 11/2019 |
| TW | 200936825 A | 9/2009 |
| TW | 201411700 A | 3/2014 |
| TW | 201428854 A | 7/2014 |
| TW | 201833990 A | 9/2018 |
| WO | 2014/175120 A1 | 10/2014 |

OTHER PUBLICATIONS

Office Action issued in TW Patent Application No. 111141770, May 6, 2024, translation.
Office Action issued in DE Patent Application No. 10 2022 211 608.9, Jun. 10, 2024, translation.
Office Action issued in Taiwanese Patent Application No. 111141770, Dec. 4, 2023, translation.
Office Action issued in KR Patent Application No. 10-2022-0144498, Nov. 28, 2024, translation.
Notice of Allowance issued is JP Patent Application No. 2022-093899, Feb. 25, 2025, partial translation.
Office Action issued in TW Patent Application No. 111141556, Jan. 12, 2024, translation.
Notice of Allowance issued in KR Patent Appl. No. 10-2022-0144503 Aug. 25, 2025, partial translation.
Office Action issued in CN Patent Appl No. 202211368047.4 dated Jul. 2, 2025, translation.
Office Action issued in CN Patent Appl No. 202211367234.0 dated Jul. 7, 2025, translation.
Office Action issued in U.S. Appl. No. 17/979,879, Jun. 18, 2025.
Office Action issued in KR Patent Application No. 10-2022-0144503, Mar. 26, 2024, translation.
Office Action issued in KR Patent Application No. 10-2022-0144503, Nov. 25, 2024, translation.
Office Action issued in DE Patent App. No. 102022211609.7, Jun. 5, 2024, translation
Office Action issued in JP Patent Application No. 2022-149738, Jun. 24, 2025, translation.
Office Action issued in JP Patent Application No. 2022-149835, Jun. 24, 2025, translation.

* cited by examiner

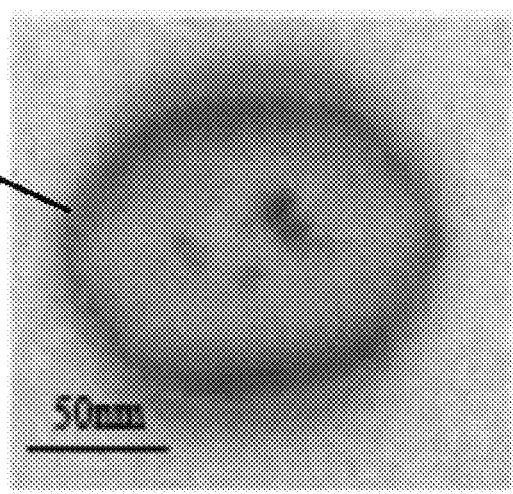
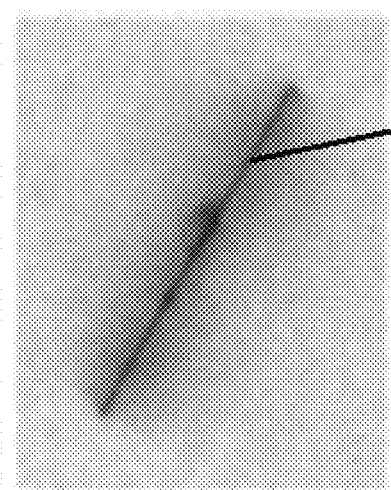
Fig. 1A    Fig. 1B
Fig. 2
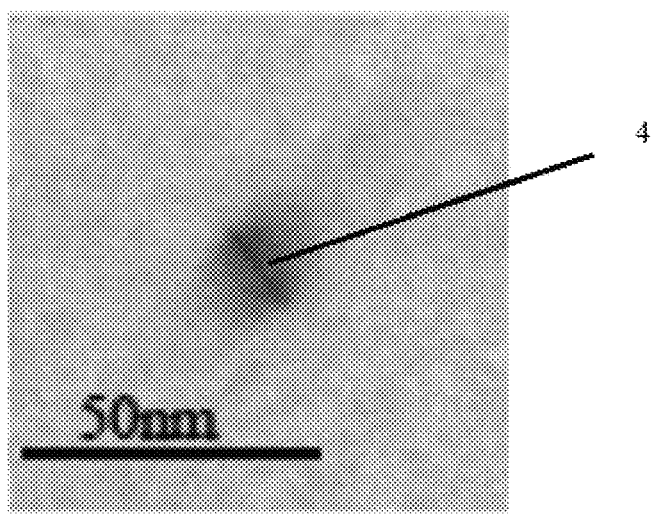

Comparative Example 4

Example 6

Comparative Example 5

Example 7

SILICON WAFER AND EPITAXIAL SILICON WAFER

CROSS-REFERENCE TO RELATED APPLICATIONS

The present application claims priority under 35 U.S.C. § 119 of Japanese Application No. 2021-180296, filed on Nov. 4, 2021, the disclosure of which is expressly incorporated by reference herein in its entirety.

BACKGROUND OF THE INVENTION

1. Field of the Invention

The present invention relates to a silicon wafer and an epitaxial silicon wafer.

2. Description of Related Art

Epitaxial silicon wafers for power MOS transistors, for instance, are required to have extremely low silicon wafer resistivity prior to forming a silicon epitaxial layer. Therefore, for the resistivity to be 1.2 mΩ·cm or less, an epitaxial silicon wafer where a silicon epitaxial layer is formed on a surface of a silicon wafer that is densely doped with phosphorus is provided.

In recent years, there has been demand to provide an n-type silicon wafer with extremely low resistivity of 0.9 mΩ·cm or less. However, when the resistivity of the silicon wafer is extremely low, a stacking fault (SF) may be generated on the silicon epitaxial layer when an epitaxial growth process is performed, and thus, there is a need to reduce SF density in the silicon epitaxial layer.

As described in WO 2014/175120, the applicant of the present application has discovered a technology to inhibit the generation of SF in a silicon epitaxial layer by using a method of adjusting a residence time (thermal history) at 570° C.±70° C. of a single crystal ingot at the time of growing a single crystal (reduce the amount of time residing at a temperature zone where SF nuclei are formed). In addition, as described in Japanese Patent Laid-open Publication No. 2014-011293, it was discovered that the generation of SF in the silicon epitaxial layer can be inhibited by using a method of performing a high-temperature heat treatment (argon annealing) prior to growing the silicon epitaxial layer.

As described in WO 2014/175120, when a silicon wafer is cut from a crystal region having a shortened residence time at the temperature zone where SF nuclei are formed (silicon wafer with few SF nuclei), the SF density in the epitaxial layer after growing the silicon epitaxial layer can be reduced. However, even with the silicon wafer having the shortened residence time at the temperature zone where SF nuclei are formed, when the resistivity of the silicon wafer is below 0.7 mΩ·cm, the SF density that occurs in the silicon epitaxial layer after growing the silicon epitaxial layer may increase.

In addition, as described in Japanese Patent Laid-open Publication No. 2014-011293, the SF density in the epitaxial layer after growing the silicon epitaxial layer can be reduced by performing argon annealing on a silicon wafer (silicon wafer with many SF nuclei) that is cut from a crystal region with a long residence time at the temperature zone where SF nuclei are formed. However, the SF density cannot be reduced to 100 defects/wafer or less. Although the prior art described in WO 2014/175120 and Japanese Patent Laid-open Publication No. 2014-011293 is effective to inhibit the generation of SF in the silicon epitaxial layer, a user requires further reduction of the SF density.

SUMMARY OF THE INVENTION

The present invention provides a silicon wafer with a low density of dislocation loop defects that may cause SF, and an epitaxial silicon wafer with low generation of SF in a silicon epitaxial layer.

After vigorous studies on the cause of SF generation in a silicon epitaxial layer, the inventors of the present invention have discovered that a silicon wafer that is densely doped with phosphorus has two major types of dislocation loop-like defects (defects in which disturbed portions of a crystal lattice are connected in a loop) depending on the thermal history that the crystal undergoes during the growth process of the single crystal ingot.

Hereafter, the details leading to the finding of dislocation loop-like defects is described. First, a silicon single crystal ingot 200 mm in diameter in which phosphorus is densely added as a dopant is grown, and a silicon wafer that is cut from a crystal region with a long residence time at the temperature zone where SF nuclei are formed (hereafter referred to as a residence time in an SF nucleation temperature zone) and a silicon wafer that is cut out from a crystal region with a short residence time in an SF nucleation temperature zone are produced.

Specifically, a silicon wafer with resistivity of 0.75 mΩ·cm that is cut from a top side of a straight body of a single crystal ingot with a residence time of 350 min or more at 570° C.±70° C. is produced as the silicon wafer with the long residence time in the SF nucleation temperature zone, and a silicon wafer with resistivity of 0.7 mΩ·cm that is cut from a bottom side of the straight body of the single crystal ingot with a residence time of 50 min or less at 570° C.±70° C. is produced as the silicon wafer with the short residence time in the SF nucleation temperature zone. Each silicon wafer is cleaved in a thickness direction and the cleavage cross section is observed by a Transmission Electron Microscope (TEM). Results are shown in FIGS. 1A and 1B.

As a result, in the silicon wafer that is cut from the crystal region with the long residence time in the SF nucleation temperature zone (top side crystal region), a large compound dislocation loop defect 2 in which the dislocation loops overlap as shown in FIG. 1A is observed and it is found that there are many densities of large defects that exceeds 60 nm in size. FIG. 1B is a photograph of the compound dislocation loop 2 that is shown in FIG. 1A, taken from a different angle, showing that the compound dislocation loop 2 has a planar shape. On the other hand, in the silicon wafer that is cut from the crystal region with the short residence time in the SF nucleation temperature zone (crystal region on the bottom side), a small dislocation loop defect 4 shown in FIG. 2 is observed and the density of the large compound dislocation loop defects that exceeds 60 nm in size is found to be low.

Also, it is found that SF generate in the silicon epitaxial layer originating from the large compound dislocation loop defect. This is believed to suggest that conditions for SF generation in a silicon epitaxial layer differ depending on the presence or absence of a compound dislocation loop defect, and therefore, the inventors of the present invention consider mechanisms for generating dislocation loops and have arrived at the conclusions below.

The inventors of the present invention made the following assumptions on the generation of dislocation loop defects. First, in a step where a silicon single crystal ingot is cooled, interstitial phosphorus that is present between lattices inside the crystal kicks out a lattice silicon that is present at a lattice position (ejects the lattice silicon), and interstitial silicon is thereby generated. The excess interstitial silicon generated coheres to create a dislocation loop and segregates the interstitial phosphorus at the dislocation loop, generating the dislocation loop defect.

Also, in order to inhibit the generation of a dislocation loop defect, inhibiting the interstitial silicon from cohering is effective and the inventors believe that the interstitial silicon can be inhibited from cohering by intentionally adding an impurity element that can pair with the interstitial silicon, and devised an idea of incorporating carbon into the crystal at a growth stage of the single crystal. A silicon single crystal ingot is grown by doping (adding) carbon to a silicon melt, and when a defect formed inside a carbon-doped silicon wafer is evaluated, the inventors reached the finding that the defect density of large dislocation loops that are formed inside the silicon wafer can be reduced, perfecting the invention.

On the other hand, Japanese Unexamined Patent Publication No. 2003-505324 describes a method that increases the density of oxygen precipitates (Bulk Micro Defect (BMD)) that are formed inside the wafer and improves the gettering performance of the epitaxial silicon wafer by adding carbon to the silicon wafer. Specifically, the invention described in Japanese Unexamined Patent Publication No. 2003-505324 is a technology that, by adding carbon, attempts to resolve a decrease in gettering performance that is caused by a decrease in oxygen concentration in the latter half of the single crystal ingot growth. Increasing BMD density by adding carbon to a silicon crystal in order to provide an epitaxial wafer with excellent gettering performance is well known beyond Japanese unexamined Patent Publication No. 2003-505324.

In general, by phosphorus thermal diffusion treatment, phosphorus ion injection treatment, formation of a phosphorus-containing epitaxial layer, and the like, a region with a high concentration of phosphorus in the silicon wafer is known to act as a gettering layer (also referred as a phosphorus gettering method). In other words, the silicon wafer of the present invention that is densely doped with phosphorus in order to keep resistivity to 1.2 mΩ·cm or less only has sufficient gettering characteristics due to the presence of a high concentration of phosphorus. Accordingly, there is no requirement to increase BMD density for the epitaxial wafer of the present invention. Therefore, there is no motivation to add carbon to the silicon wafer of the present invention, which is densely doped with phosphorus, to increase BMD density and increase gettering performance. In addition, there is no discussion in Japanese Unexamined Patent Publication No. 2003-505324 about the specific issue of frequent generation of SF in a silicon wafer that is densely doped with phosphorus so as to keep substrate resistivity to 1.2 mΩ·cm or less.

A silicon wafer according to the present invention is 200 mm in diameter, and in which a dopant is phosphorus, resistivity is from 0.5 mΩ·cm to 1.2 mΩ·cm, and carbon concentration is $3.0 \times 10^{16}$ atoms/cm$^3$ or more.

The resistivity of the silicon wafer defined by the present invention is a value obtained by measuring the surface of the silicon wafer with the four-point probe method. The carbon concentration of the silicon wafer defined by the present invention is a value obtained by thinning the silicon wafer by polishing and measuring the carbon concentration about the center of the silicon wafer in the depth direction (a center-depth location) using secondary ion mass spectrometry (SIMS). It is difficult to accurately measure the carbon concentration of an outermost surface of the silicon wafer due to a large number of noise components, and therefore accurate measurement of the carbon concentration is possible when the measurement is performed at a depth position of 1 μm or more from the wafer surface so as to exclude the outermost surface. In the present invention, in order to obtain a more accurate value, the concentration is defined by the concentration about the center of the silicon wafer in the depth direction.

For the silicon wafer noted above, oxygen concentration of the silicon wafer may be $4.0 \times 10^{17}$ atoms/cm$^3$ or more to $10 \times 10^{17}$ atoms/cm$^3$ or less. The oxygen concentration of the silicon wafer defined by the present invention is a value obtained by thinning the silicon wafer by polishing, and then measuring the oxygen concentration about the center of the silicon wafer in the depth direction using SIMS. It is difficult to accurately measure the oxygen concentration of the outermost surface of the silicon wafer due to a large number of noise components, and therefore accurate measurement of the oxygen concentration is possible when the measurement is performed at a depth position of 1 μm or more from the wafer surface so as to exclude the outermost surface. In the present invention, in order to obtain a more accurate value, the concentration is defined by the concentration about the center of the silicon wafer in the depth direction.

Preferably, the above-noted silicon wafer is substantially free of COPs. In the present invention, "substantially free of COPs" means a silicon wafer in which no COPs are detected by an observational evaluation that is described below. Specifically, first, SC-1 cleaning (cleaning using liquid mixed of ammonia water, hydrogen peroxide solution, and ultrapure water at 1:1:15) is performed on a silicon wafer that is cut from a single crystal silicon ingot grown using the CZ method and processed, the observational evaluation of the surface of the silicon wafer following the cleaning is performed using a SURFSCAN SP-1 manufactured by KLA-Tencor Corporation as a surface defect inspection device, and a Light Point Defect (LPD) that is estimated as a surface pit is specified. At that time, an observation mode is set as an oblique mode (oblique incidence mode) and estimation of the surface pit is performed based on a detected size ratio of wide/narrow channels. The LPD specified in this way is evaluated for the presence of COPs using an Atomic Force Microscope (AFM). With this observational evaluation, a silicon wafer with no observation of COPs is referred to as "a silicon wafer with no COPs."

The epitaxial silicon wafer according to the present invention includes the silicon wafer that is 200 mm in diameter, in which the dopant is phosphorus, the resistivity is from 0.5 mΩ·cm to 1.2 mΩ·cm, and the carbon concentration is $3.0 \times 10^{16}$ atoms/cm$^3$; and a silicon epitaxial layer that is on a surface of the silicon wafer.

The resistivity of the silicon wafer of the epitaxial silicon wafer defined by the present invention is a value obtained by measuring a backside of the silicon wafer by the four-point probe method. Further, when an oxide film is provided on the backside of the epitaxial silicon wafer, the value is obtained by measuring, by the four-point probe method, the backside of the silicon wafer from which a backside oxide film is removed. The carbon concentration of the silicon wafer of the epitaxial silicon wafer defined by the present invention is a value obtained by thinning the silicon wafer by polishing and measuring the carbon concentration about the center of the silicon wafer in the depth direction using SIMS.

In producing the epitaxial silicon wafer, since the silicon wafer undergoes high-temperature heat treatment at the time of epitaxial growth and high-temperature heat treatment prior to an epitaxial growth process and the like, the carbon outwardly diffuses and reduces the carbon concentration in a surface layer of the silicon wafer. Therefore, the carbon concentration of the silicon wafer of the epitaxial silicon wafer needs to be measured at a depth position where there is no carbon outward diffusion, and when measured at a depth position of 40 μm or more in a depth direction of wafer thickness almost from the wafer surface, accurate measurement of the carbon concentration is possible. In the present invention, in order to obtain a more accurate value, the concentration is defined by the concentration about the center of the silicon wafer in the depth direction.

The epitaxial silicon wafer according to the present invention includes the silicon wafer that is 200 mm in diameter, in which the dopant is phosphorus, the resistivity is from 0.5 mΩ·cm to 1.2 mΩ·cm, and the carbon concentration is $3.0 \times 10^{16}$ atoms/cm$^3$; and the silicon epitaxial layer that is on the surface of the silicon wafer, in which the silicon wafer is provided with a low carbon concentration layer on a surface side that is in contact with the silicon epitaxial layer, the carbon concentration of the low carbon concentration layer is at most 0.9 times the carbon concentration about the center of the silicon wafer in the depth direction, and the depth of the low carbon concentration layer is 5 μm or more and 15 μm or less from the surface of the silicon wafer. That is to say, the carbon concentration is decreased by 10% or more starting from a depth in the silicon substrate of about 5 μm from the boundary, compared with the carbon concentration at about the center, in the depth direction, of the silicon wafer. In another embodiment, the carbon concentration is decreased by 10% or more starting from a depth in the silicon substrate of anywhere from 5 μm to 15 μm from the boundary, compared with the carbon concentration at about the center, in the depth direction, of the silicon wafer.

The depth of the low carbon concentration layer is a value based on a carbon concentration profile in the depth direction obtained by SIMS measurement and means the depth position (width) in the depth direction of the silicon wafer from an interface between the epitaxial layer and the silicon wafer.

In the epitaxial silicon wafer, the resistivity of the silicon wafer is preferably 0.9 mΩ·cm or less.

In the epitaxial silicon wafer, the carbon concentration on the silicon wafer surface that is in contact with the epitaxial layer is preferably $1.0 \times 10^{16}$ atoms/cm$^3$ or less.

In the epitaxial silicon wafer, the oxygen concentration of the silicon wafer is preferably $4.0 \times 10^{17}$ atoms/cm$^3$ or more and $10 \times 10^{17}$ atoms/cm$^3$ or less.

The oxygen concentration of the silicon wafer of the epitaxial silicon wafer defined by the present invention is a value obtained by thinning the silicon wafer by polishing, and then measuring the oxygen concentration about the center of the silicon wafer in the depth direction using SIMS. The oxygen concentration of the silicon wafer of the epitaxial silicon wafer needs to be measured at a depth position where there is no oxygen outward diffusion, and when measured at a depth position of 150 μm or more in the depth direction of the wafer thickness almost from the wafer surface, accurate measurement of the oxygen concentration is possible. In the present invention, in order to obtain a more accurate value, the concentration is defined by the concentration about the center of the silicon wafer in the depth direction.

In the epitaxial silicon wafer, preferably there are no COPs in the silicon wafer.

In the epitaxial silicon wafer, the oxide film is preferably provided to the backside of the silicon wafer.

In the epitaxial silicon wafer, preferably there is no oxide film at an outer periphery of the backside and an end portion of the silicon wafer.

In the epitaxial silicon wafer, a density of LPD that are 0.09 μm or more in size observed on the surface of the epitaxial layer is preferably 100 defects/wafer or less.

In the epitaxial silicon wafer, a density of LPD that are 0.09 μm or more in size observed on the surface of the epitaxial layer is preferably 60 defects/wafer or less.

In the epitaxial silicon wafer, a density of LPD that are 0.09 μm or more in size observed on the surface of the epitaxial layer is preferably 10 defects/wafer or less.

BRIEF DESCRIPTION OF THE DRAWINGS

The present invention is further described in the detailed description that follows, in reference to the noted plurality of drawings by way of non-limiting examples of exemplary embodiments of the present invention, in which like reference numerals represent similar parts throughout the several views of the drawings, and wherein:

FIGS. 1A and 1B are photographs of a compound dislocation loop that is observed in a silicon wafer that is cut from a crystal region with a long residence time in an SF nucleation temperature zone;

FIG. 2 is a photograph of a dislocation loop that is observed in a silicon wafer that is cut from a crystal region with a short residence time in an SF nucleation temperature zone;

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, an embodiment of the present invention is described with reference to the drawings. A silicon wafer according to the present invention is 200 mm in diameter, is doped with phosphorus, which is a dopant for resistivity adjustment, has resistivity of 0.5 mΩ·cm or more and 1.2 mΩ·cm or less, and has a carbon concentration of $3.0\times10^{16}$ atoms/cm$^3$ or more. The silicon wafer having a diameter of 200 mm that is defined by the present invention means a silicon wafer having a diameter of 200±0.5 mm due to a machining error and the like. In addition, an epitaxial silicon wafer according to the present invention includes a silicon epitaxial layer that is on the silicon wafer.

Figure 3:
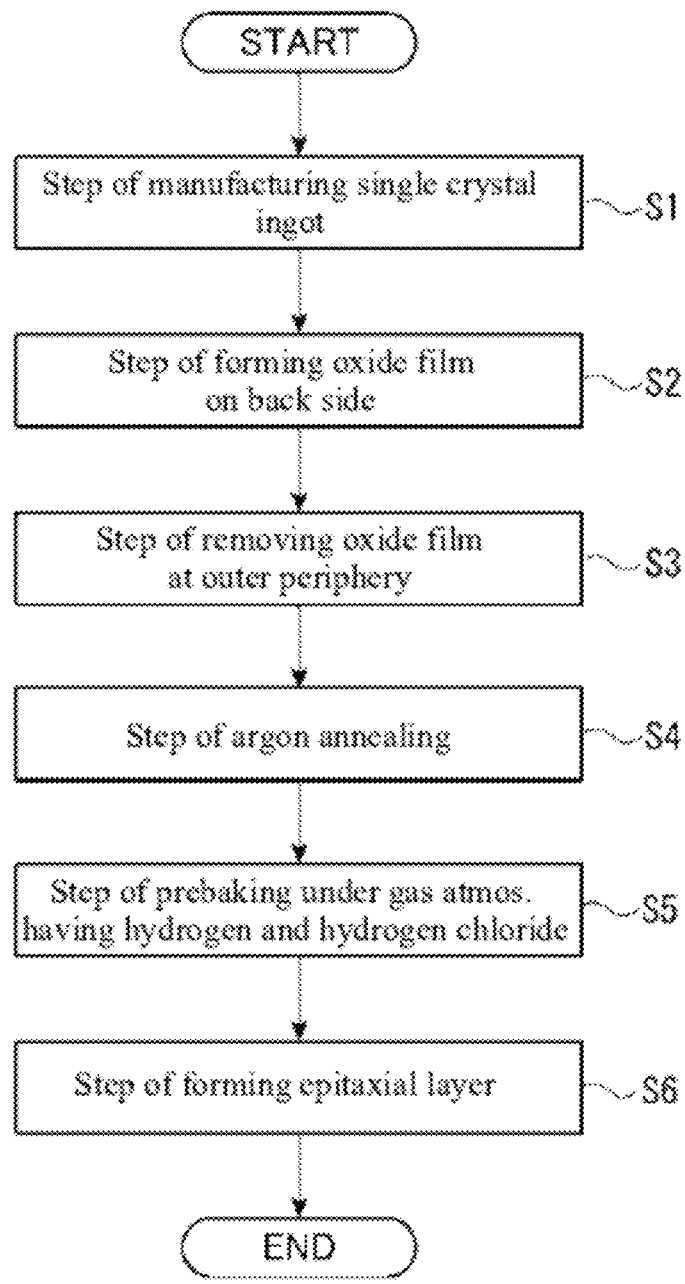
FIG. 3 is a flow chart illustrating an embodiment of a method for manufacturing an epitaxial silicon wafer according to the present invention.

A favorable manufacturing flow for obtaining an epitaxial silicon wafer according to the present invention is shown in FIG. 3. The manufacturing flow preferably includes a step of manufacturing a single crystal ingot (S1), a step of forming an oxide film on a back side (S2), a step of removing the oxide film at an outer periphery (S3), a step of argon annealing (S4), a step of prebaking (S5), and a step of forming an epitaxial layer (S6).

In the single crystal ingot manufacturing step S1, according to the Czochralski (CZ) method, which uses a single crystal ingot pulling apparatus (not shown), a 200 mm-diameter single crystal silicon ingot doped with phosphorus as an n-type dopant is manufactured satisfying the following conditions.

Phosphorus Concentration

By doping red phosphorus such that the phosphorus concentration in the single crystal ingot is $6.0\times10^{19}$ atoms/cm$^3$ or more and $1.64\times10^{20}$ atoms/cm$^3$ or less, a single crystal ingot with resistivity of 0.5 mΩ·cm or more and 1.2 mΩ·cm or less can be obtained. In addition, by configuring the phosphorus concentration to be $8.3\times10^{19}$ atoms/cm$^3$ or more, a single crystal ingot with resistivity of 0.9 mΩ·cm or less can be obtained. The phosphorus concentration of the silicon wafer is a value obtained by measuring the phosphorus concentration about the center of the silicon wafer in the depth direction using SIMS. The phosphorus concentration can be found from the resistivity measured by the four-point probe method using a formula or a graph prescribed by SEMI MF723-0307. When phosphorus is doped prior to melting a silicon raw material, phosphorus may evaporate during the melting of the silicon raw material and a desired resistivity cannot be obtained. Therefore, it is preferred to dope red phosphorus into the silicon melt after the silicon raw material is melted.

Carbon Concentration

By adding carbon powder to the crucible with the silicon raw material and melting the material such that the carbon concentration in the single crystal ingot is $3.0\times10^{16}$ atoms/cm$^3$ or more and $5.0\times10^{17}$ atoms/cm$^3$ or less, s single crystal ingot having a predetermined carbon concentration can be grown. By setting the carbon concentration to be $3.0\times10^{16}$ atoms/cm$^3$ or more, a dislocation loop defect that forms inside the silicon wafer can be reduced in size and density and SF density generated in the epitaxial layer after the epitaxial growth process can be significantly reduced. Specifically, even with a silicon wafer cut from the top side of a crystal with a long residence time in an SF nucleation temperature zone, the wafer functions as a silicon wafer that reliably allows LPD density on the surface of the silicon epitaxial layer after the epitaxial growth process to be 100 defects/wafer or less.

Although the effect of reducing the LPD density (SF density) that is generated in the epitaxial layer is enhanced as the carbon concentration increases, when the carbon concentration exceeds $5.0\times10^{17}$ atoms/cm$^3$, dislocation becomes more likely to occur in the single crystal during the process of growing the single crystal ingot, which makes it difficult to grow the single crystal ingot with no dislocations. From a viewpoint of stabilizing manufacture of single crystal ingots, the carbon concentration is more preferably $3.0\times10^{17}$ atoms/cm$^3$ or less.

Oxygen Concentration

When the oxygen concentration of the silicon wafer is high, device pressure resisting characteristics tend to be deteriorated, as noted below, and therefore it is preferable to keep the oxygen concentration in the single crystal ingot low, and the oxygen concentration is preferably in a range of $4.0\times10^{17}$ atoms/cm$^3$ or more and $10\times10^{17}$ atoms/cm$^3$ or less.

In order to grow a single crystal ingot with low oxygen concentration, it is preferably to apply a magnetic field to the silicon melt, and a well-known horizontal magnetic field or cusp magnetic field may be applied. The oxygen concentration incorporated into the single crystal can be reduced to the desired concentration by slowing down the rotation of a crucible that stores the silicon melt and by lowering the furnace pressure of the pulling apparatus, and the like. When the oxygen concentration is less than $4.0\times10^{17}$ atoms/cm$^3$, the silicon wafer has low strength and slip dislocation may occur when the silicon wafer undergoes high-temperature heat treatment. Therefore, the oxygen concentration is preferably $4.0\times10^{17}$ atoms/cm$^3$ or more.

After this, a silicon wafer is cut from s single crystal ingot that is manufactured using the single crystal ingot manufacturing step S1 and a predetermined process (such as grinding, etching, and polishing processes) is performed to create a mirror surface silicon wafer with excellent surface roughness and flatness.

In the backside oxide film formation step S2, preferably the oxide film (hereafter referred to as the backside oxide film) is formed on the backside of the silicon wafer using a CVD device under the following condition ranges.

Raw material gas: mixed gas of monosilane (SiH$_4$) and oxygen (O$_2$)

Thickness of the backside oxide film: from 100 nm to 1500 nm

Film formation temperature: from 400° C. to 450° C.

Providing a backside oxide film of this type can inhibit auto-doping and can inhibit resistance fluctuation in the epitaxial layer.

In the backside oxide film formation step S2, it is difficult to form the oxide film only on the backside of the silicon wafer, and an oxide film forming on the end portion (chamfered portion) of the silicon wafer after the backside oxide film formation step S2 may be unavoidable. When the epitaxial layer is formed on the surface of the oxide film, nodules (granular silicon) may appear in the area, so it is preferable to remove the oxide film that is formed at the outer periphery of the backside and the end portion of the silicon wafer.

Accordingly, in the outer periphery oxide film removal step S3, with the use of various methods such as polishing and etching, the oxide film present on the end portion (chamfered portion) of the silicon wafer and the outer periphery of the wafer backside may be removed. The oxide film present on the outer periphery of the wafer backside is preferably removed over an area less than 5 mm from an outer edge of the silicon wafer. By removing the outer periphery of the backside oxide film and the end portion of the silicon wafer in this way, the occurrence of nodules during the growth of the silicon epitaxial layer can be prevented and the occurrence of particles from the wafer edge can be prevented.

In the argon annealing step S4, heat treatment is preferably performed under the following condition ranges.

Gas atmosphere: argon gas
Heat treatment temperature: from 1150° C. to 1250° C.
Heat treatment time: from 30 to 120 min A batch furnace (vertical heat treatment device) capable of heat-treating a plurality of silicon wafers at once is preferably used as a heat treatment device to perform the heat treatment.

With highly concentrated carbon doping, the generation of a large dislocation loop defect in the silicon wafer is inhibited and small dislocation loop defects present on the silicon wafer can be eliminated by performing argon annealing on the silicon wafer, and the generation of SF in the epitaxial layer can be reduced as much as possible.

Figure 4A:
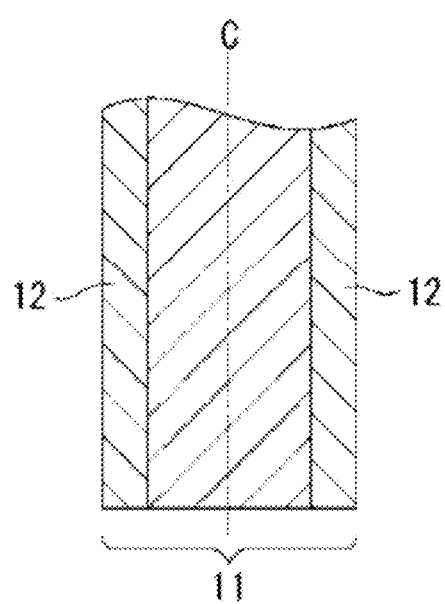
FIGS. 4A and 4B are cross-sectional views of the embodiment of the epitaxial silicon wafer according to the present invention.

In addition, by performing argon annealing on the silicon wafer prior to the epitaxial growth process, carbon diffusion to the silicon epitaxial layer from the silicon wafer that is generated during the epitaxial layer formation step S6 can be reduced. This point is described below. FIG. 4A is a schematic view illustrating a low carbon concentration layer formed on a surface layer of the silicon wafer by argon annealing. As shown in FIG. 4A, by performing high-temperature argon annealing on a silicon wafer 11, carbon in the surface layer of the silicon wafer 11 outwardly diffuses and the carbon concentration of the surface layer is reduced. Thereby, a low carbon concentration layer 12 is formed on a front and backside of the silicon wafer 11, the low carbon concentration layer 12 having a lower carbon concentration than the carbon concentration about the center C of the silicon wafer 11 where carbon outward diffusion does not occur.

Figure 4B:
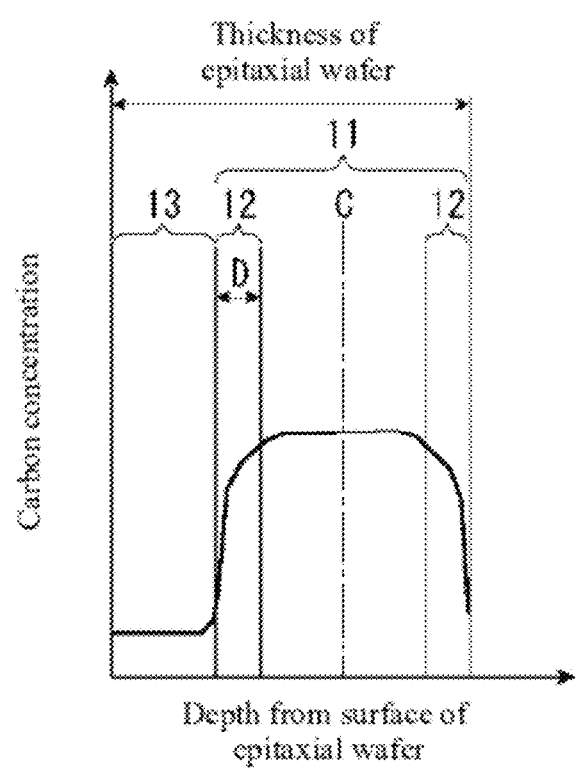

FIG. 4B is a schematic view illustrating a carbon concentration profile when the epitaxial growth process is performed on the silicon wafer subjected to argon annealing. As shown in FIG. 4B, the carbon concentration after the epitaxial layer formation step S6 shows a concentration profile where the carbon concentration in the surface layer of the silicon wafer is reduced. Here, when a region is defined as the low carbon concentration layer 12, the region having a carbon concentration that is 0.9 times or less that of the center C of the silicon wafer 11 where carbon outward diffusion does not occur, after the epitaxial growth process, a depth D of the low carbon concentration layer 12 formed on a surface side of the silicon wafer 11 that is in contact with the silicon epitaxial layer 13 can be 5 μm or more and 15 μm or less. That is to say, the carbon concentration is decreased by 10% or more starting from a depth in the silicon substrate of about 5 μm from the boundary, compared with the carbon concentration at about the center, in the depth direction, of the silicon wafer. In another embodiment, the carbon concentration is decreased by 10% or more starting from a depth in the silicon substrate of anywhere from 5 μm to 15 μm from the boundary, compared with the carbon concentration at about the center, in the depth direction, of the silicon wafer. With formation of the low carbon concentration layer 12, carbon diffusion to the silicon epitaxial layer 13 from the silicon wafer 11 that is generated during the epitaxial layer formation step S6 can further be reduced. The thickness of the low carbon concentration layer 12 can be adjusted as desired by adjusting time and heat treatment temperature of the argon annealing.

In the prebaking step S5 under an atmosphere of gas that includes hydrogen and hydrogen chloride, a heat treatment is preferably performed on the silicon wafer under the following condition ranges in an internal epitaxial device (CENTURA®, manufactured by Applied Materials, Inc.).

Atmosphere: hydrogen gas, hydrogen chloride gas
Hydrogen gas flow: 40 L/min
Hydrogen chloride gas flow: 1 L/min
Heat treatment temperature: from 1150° C. to 1250° C.
Heat treatment time: from 30 to 300 seconds The margin of the surface layer of the silicon wafer resulting from the prebaking step S5 is preferably 100 nm to 300 nm, and more preferably 150 nm±10 nm.

In the epitaxial layer formation step S6, an epitaxial layer is preferably grown under the following condition ranges on the silicon wafer that has undergone the prebaking step S5.

Dopant gas: phosphine ($PH_3$) gas
Material source gas: trichlorosilane ($SiHCl_3$) gas
Carrier gas: hydrogen gas
Growth temperature: from 1050° C. to 1150° C.
Thickness of epitaxial layer: from 1 μm to 10 μm
Epitaxial layer resistivity: from 0.01 mΩ·cm to 10 mΩ·cm
Phosphorus concentration: from $4.44 \times 10^{14}$ atoms/cm$^3$ to $4.53 \times 10^{18}$ atoms/cm$^3$ By performing the epitaxial layer formation step S6, the epitaxial silicon wafer where the silicon epitaxial layer is formed on the surface of the silicon wafer is manufactured.

By performing the process flow noted above, it is possible to provide a silicon wafer that can reduce the generation of SF in the epitaxial layer, and to provide an epitaxial silicon wafer where the SF density in the epitaxial layer is reduced. Specifically, a new silicon wafer that not previously existed is provided, where the silicon wafer is 200 mm in diameter, phosphorus is added such that the resistivity is from 0.5 mΩ·cm to 1.2 mΩ·cm, and the silicon wafer is densely doped with carbon such that the carbon concentration is $3.0 \times 10^{16}$ atoms/cm$^3$ or more.

Through highly concentrated carbon doping, the density of large dislocation loop defects in the silicon wafer is reduced. The silicon wafer functions effectively as a bulk wafer for epitaxial growth that can reduce the generation of epitaxial defects (LPD or SF observed on the surface of the epitaxial layer).

Moreover, by configuring the oxygen concentration of the silicon wafer to be in a range from $4.0 \times 10^{17}$ atoms/cm$^3$ to $10 \times 10^{17}$ atoms/cm$^3$, when carbon is doped, poor device pressure resistance can be prevented.

In addition, by performing argon annealing on the silicon wafer before forming the silicon epitaxial layer, the carbon concentration in the surface layer of the silicon wafer is reduced and an amount of carbon diffusion to the silicon epitaxial layer that is generated during the silicon epitaxial layer formation can be reduced. By reducing the amount of carbon diffusion to the silicon epitaxial layer, at the time of heat treatment in a device process where a device is fabricated on the epitaxial silicon wafer, deterioration of electric characteristics due to the generation of a defect caused by carbon incorporated in the silicon epitaxial layer can be inhibited.

In the above-noted embodiment, the resistivity of the silicon wafer is from 0.5 mΩ·cm to 1.2 mΩ·cm. However, as the silicon wafer with better resistivity, preferably the resistivity is from 0.5 mΩ·cm to 0.9 mΩ·cm. The lower the resistivity is, the more noticeable the generation of SF in the epitaxial layer becomes, and therefore the effect of carbon doping according to the present invention is more apparent.

Further, the silicon wafer according to the present embodiment is manufactured from the single crystal ingot grown from the silicon melt that is doped with phosphorus such that the resistivity is 1.2 mΩ·cm or less. Because phosphorus is densely added, an oxidation-induced stacking fault (OSF) ring region where OSF is generated in the process of manufacturing the single crystal ingot is eliminated, centering around the ingot, and becomes a crystal region with no COPs. In other words, the silicon wafer according to the present embodiment can be configured as a silicon wafer with no COPs by densely adding phosphorus and the generation of defects caused by COPs in the epitaxial layer can be prevented.

EXAMPLES

Hereafter, experimental conditions and evaluation results of examples and comparative examples of the present invention are described.
<Dislocation Loop Evaluation>
Dislocation loops are evaluated for the following Example 1 and Comparative Example 1.

Example 1

In Example 1, an epitaxial silicon wafer is manufactured under the condition ranges of the manufacturing flow of the epitaxial silicon wafer described with reference to FIG. 3. The growth conditions of the single crystal ingot are to manufacture a single crystal ingot by adding carbon powder before melting a silicon raw material and by adding phosphorus into the silicon melt after the silicon raw material is melted such that the resistivity on a top end of a straight body of the single crystal ingot is 0.9 mΩ·cm. A sample wafer is cut from the position of the ingot on the top side of the straight body of the single crystal ingot to which the carbon was added, and a mirror surface silicon wafer is manufactured by performing predetermined processing. The resistivity of the silicon wafer is 0.75 mΩ·cm when measured by the four-point probe method and the carbon concentration of the silicon wafer is $5.0\times10^{16}$ atoms/cm$^3$.

Comparative Example 1

Compared to Example 1 above, the silicon wafer is manufactured under the same manufacturing conditions as Example 1, except that carbon doping is not performed at the stage of growing the single crystal ingot. Similar to Example 1, a sample wafer with resistivity of 0.75 mΩ·cm is cut and a mirror surface silicon wafer is produced by performing the predetermined processing.

Figure 5A:
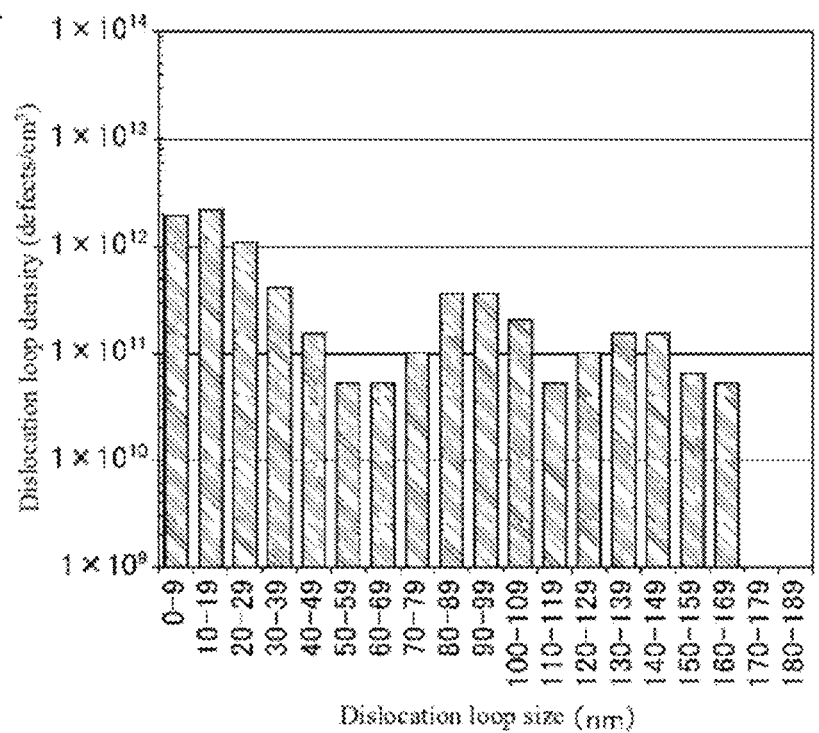
FIGS. 5A and 5B are graphs illustrating evaluation results for dislocation loops in the epitaxial silicon wafers of Example 1 and Comparative Example 1.
Figure 5B:
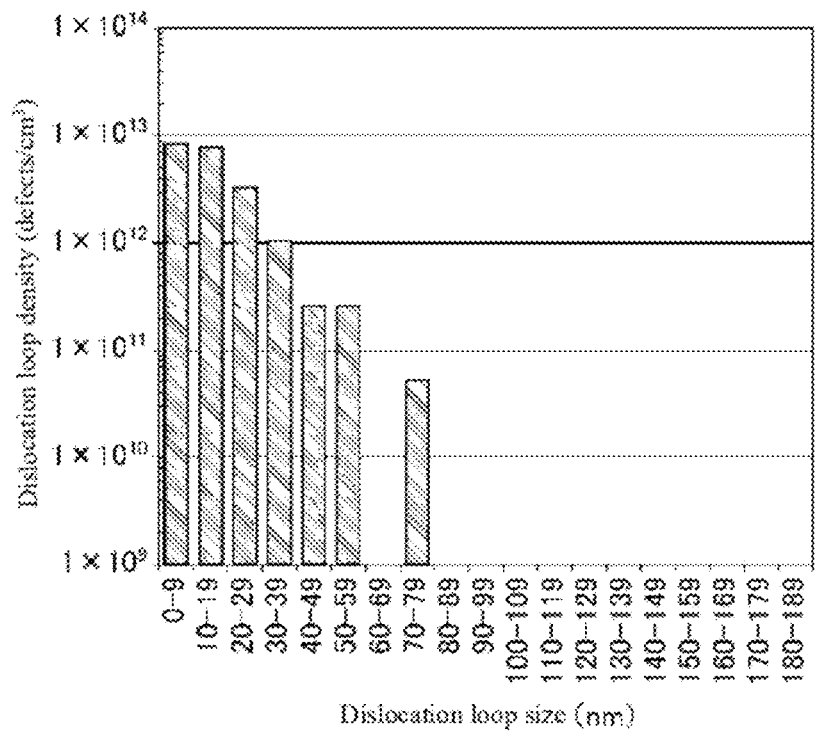

The silicon wafers of Example 1 and Comparative Example 1 are cleaved in the depth direction and the cleavage cross section is observed by a Transmission Electron Microscope (TEM). FIGS. 5A and 5B are graphs illustrating evaluation results for dislocation loops in the silicon wafers of Example 1 and Comparative Example 1. In FIGS. 5A and 5B, the horizontal axis represents dislocation loop size and the vertical axis represents dislocation loop density. FIG. 5A shows the results for the silicon wafer of Comparative Example 1, which is not doped with carbon, and since the sample wafer that is cut from the top side of the crystal with the long residence time in the SF nucleation temperature zone is used, a large number of large dislocation loops that exceed 60 nm in size were observed. On the other hand, FIG. 5B shows the results for the silicon wafer of Example 1, which is densely doped with carbon, and since the sample wafer that is cut from the top side of the crystal with the long residence time in the SF nucleation temperature zone is used, the density of large dislocation loops that exceed 60 nm is found to be significantly lowered, although a large number of small dislocation loops are observed. In other words, the density of large dislocation loops that are formed in the silicon wafer is found to be reduced by carbon doping.
[LPD Density Evaluation]

When a silicon epitaxial layer is formed using a sample silicon wafer cut from the top side of the straight body of an ingot with a long residence time in the temperature zone where SF nuclei are formed, the SF is frequently generated in the epitaxial layer and the LPD density is increased, and therefore, in the present example, a sample silicon wafer for Examples 2 and 3 and Comparative Examples 2 and 3 below that is cut from the top side of the straight body is produced and the LPD density that is observed on the surface of the epitaxial layer after the epitaxial layer formation is measured.

Specific conditions for the backside oxide film formation step and the epitaxial layer formation step, which are performed as a common treatment in both the Examples and Comparative Examples, are as follows.
[Backside Oxide Film Formation Conditions]

A backside oxide film is formed on the backside of each silicon wafer (opposite surface from the surface where the epitaxial layer is formed) under the following conditions.
Raw material gas: mixed gas of monosilane (SiH$_4$) and oxygen (O$_2$)
Film formation method: CVD method
Film formation temperature: 400° C.
Thickness of the backside oxide film: 550 nm
The oxide film present on the chamfered portion and the outer periphery of the backside of each silicon wafer is removed by an etching process.
[Hydrogen Baking Treatment Conditions]
Atmosphere: hydrogen gas
Heat treatment temperature: 1200° C.
Heat treatment time: 30 seconds
[Epitaxial Film Growth Conditions]
Dopant gas: phosphine (PH$_3$) gas
Material source gas: trichlorosilane (SiHCl$_3$) gas
Carrier gas: hydrogen gas
Growth temperature: 1080° C.
Thickness of epitaxial layer: 4 μm
Resistivity (epitaxial film resistivity): 0.3 Ω·cm Comparative Example 2

An epitaxial silicon wafer is manufactured without performing carbon doping, by forming a silicon epitaxial layer with 4 μm thickness on the surface of the silicon wafer of Comparative Example 1 in which a large number of dislocation loops are observed.

Comparative Example 3

After performing argon annealing (heat treatment at 1200° C. for 30 min under an argon gas atmosphere) on the silicon wafer of Comparative Example 1, an epitaxial silicon wafer is manufactured by forming a silicon epitaxial layer with 4 μm thickness on the surface of the silicon wafer.

Example 2

An epitaxial silicon wafer is manufactured without performing argon annealing on the silicon wafer of Example 1, in which carbon doping was performed, by forming a silicon epitaxial layer with 4 μm thickness on the surface of the silicon wafer.

Example 3

After performing argon annealing (heat treatment for 1200° C.×30 min under the argon gas atmosphere) to the silicon wafer in Example 1, the epitaxial silicon wafer is manufactured by forming the silicon epitaxial layer with 4 μm thickness on the surface of silicon wafer. Conditions for epitaxial growth process are the same for Examples 2, 3 and Comparative Examples 2, 3.

The LPD density on the surface of the silicon epitaxial layer of the epitaxial silicon wafer of Comparative Example 2 is measured using a surface defect inspection device (SURFSCAN SP-1 manufactured by KLA-Tencor Corporation). Specifically, measurement is performed in Normal mode (DCN mode) and a density of LPD that are 90 nm or more in size observed on the surface of the epitaxial layer is measured. The measurement area is the surface of the epitaxial layer excluding the annular region from the circumferential edge of the epitaxial silicon wafer to 3 mm from the circumferential edge in the radial direction. The number of counted LPD can be considered as a number of SF. As a result, the measurement of LPD itself cannot be performed because of overflow (100,000 defects/wafer or more) due to the detected number being too large. In Comparative Example 3, in which argon annealing is performed on the silicon wafer, although the LPD density can be reduced compared to Comparative Example 2, 235 LPD/wafer are observed. The following LPD density measurements for each example and each comparison are performed under the same conditions as in Comparative Example 2.

When the LPD density on the surface of the silicon epitaxial layer of the epitaxial silicon wafer in Example 2 is measured, 90,000 LPD/wafer or more are observed. This is presumed to be due to a large number of small dislocation loops less than 60 nm in size being presented, although the density of large compound dislocation loops in the silicon wafer is reduced by carbon doping.

In Example 3, in which argon annealing is performed on the silicon wafer prior to the epitaxial growth process, the LPD density on the surface of the epitaxial layer is significantly reduced and an LPD density of 56 defects/wafer is observed. This is considered to be due to small dislocation loops less than 60 nm in size that are present in the surface layer of the silicon wafer being removed by argon annealing.

Given the above, when carbon is doped and argon annealing is performed to the silicon wafer, the effect of reducing the generation of SF in the silicon epitaxial layer is enhanced and it is clear that the LPD density after the epitaxial layer formation can be reduced to about one-fourth compared to Comparative Example 3.

[Carbon Concentration Profile Evaluation]

When carbon is densely doped, due to the heat treatment during the formation of the silicon epitaxial layer, carbon diffusion to the silicon epitaxial layer may occur, and therefore, behavior of carbon diffusion to the silicon epitaxial wafer is evaluated.

Example 4

A silicon wafer with high carbon concentration (carbon concentration about the center of the wafer in the depth direction: $6.5 \times 10^{16}$ atoms/cm$^3$) is prepared and an epitaxial silicon wafer is manufactured in which a silicon epitaxial layer similar to Example 2 is formed without performing argon annealing.

Example 5

After performing the same argon annealing as in Example 3 on a silicon wafer similar to that of Example 4, an epitaxial silicon wafer is manufactured in which a silicon epitaxial layer is formed.

Figure 6:
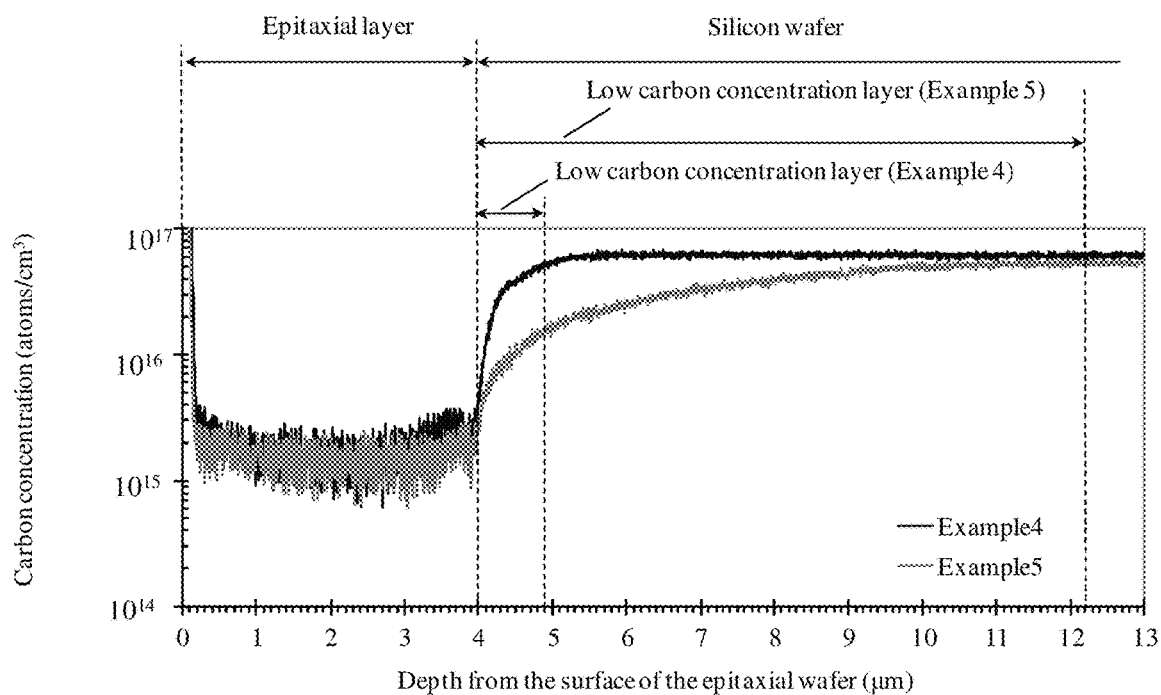
FIG. 6 is a graph illustrating research findings for a carbon concentration profile of the epitaxial silicon wafers of Examples 4 and 5.
Figure 7A:
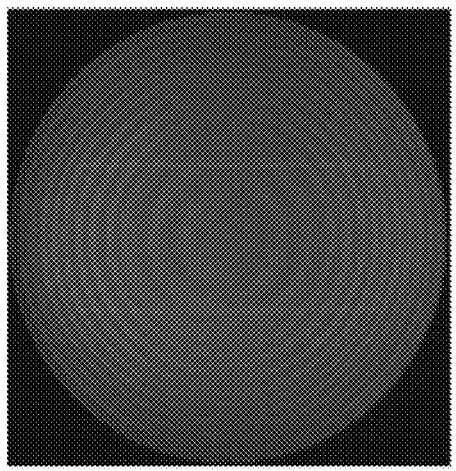
FIGS. 7A to 7D are X-ray topography images of the surface of silicon wafers of Examples 6 and 7 and Comparative Examples 4 and 5.
Figure 7B:
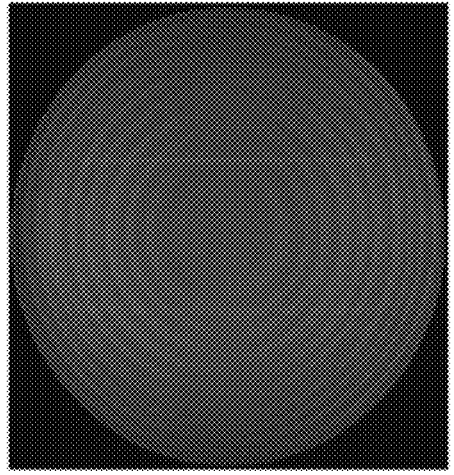
Figure 7C:
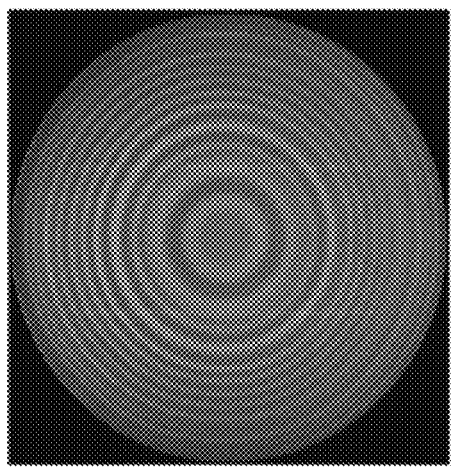
Figure 7D:
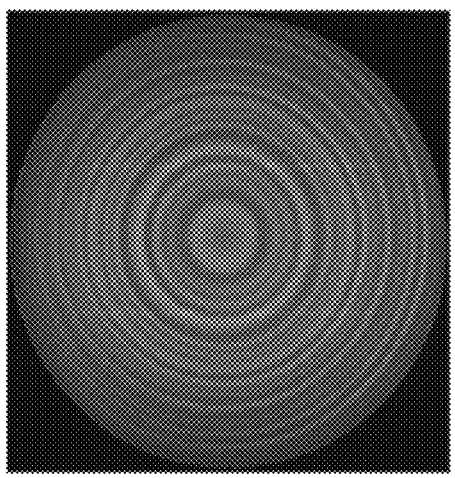

FIG. 6 is a graph illustrating research findings for a carbon concentration profile measured by secondary ion mass spectrometry for the epitaxial silicon wafers of Examples 4 and 5. The horizontal axis in FIG. 6 represents a depth from the surface of the epitaxial silicon wafer and the vertical axis represents carbon concentration. There is an interface between the silicon epitaxial layer and the silicon wafer at a depth of 4 μm from the surface of the epitaxial silicon wafer.

In Example 4, in which argon annealing is not performed on the silicon wafer, the width of the low carbon concentration layer is less than 1 μm. That is, the carbon concentration is decreased at a depth within 1 μm from the surface of the silicon wafer, compared to the carbon concentration near the center depth of the silicon wafer. On the other hand, in Example 5, in which argon annealing is performed before forming the silicon epitaxial layer, a low carbon concentration layer having 8.2 μm thickness is formed in the depth direction of the wafer from the interface between the silicon epitaxial layer and silicon wafer, and it was found that the carbon concentration of the silicon epitaxial layer covers almost the entire epitaxial layer except for the vicinity of the interface with the silicon wafer, and the carbon concentration is a detection limit or less ($2.0 \times 10^{15}$ atoms/cm$^3$ or less). That is, the carbon concentration is decreased at a depth within 8.2 μm from the surface of the silicon wafer, compared with the carbon concentration near the center depth of the silicon wafer. The thickness of the low carbon concentration layer depends on the argon annealing conditions. For example, all other conditions are set similar to those in Example 5, and when heat treatment conditions are changed to 1150° C. for 10 min, the thickness is 5.6 μm, 7.3 μm when heat treatment conditions are changed to 1200° C. for 10 min, 7.3 μm when heat treatment conditions are changed to 1150° C. for 60 min, and 9.4 μm when heat treatment conditions are changed to 1200° C. for 60 min. In other words, the thickness of the low carbon concentration layer can be adjusted as desired by adjusting the heat treatment temperature and time for argon annealing. By forming a low carbon concentration layer of a predetermined thickness on the surface layer of the silicon wafer, the amount of carbon diffusion to the epitaxial layer from the silicon wafer can be reduced.

[Slip Dislocation Evaluation]

For the following Comparative Examples 4 and 5 and Examples 6 and 7, studies are performed as to whether slip dislocation (defect along a silicon crystal surface) occurs based on whether carbon doping or argon annealing were performed. Specifications and conditions shared by Comparative Examples 4 and 5 and Examples 6 and 7 are listed below.

Resistivity: 0.82 mΩ·cm
Carbon concentration: $4.0 \times 10^{16}$ atoms/cm$^3$

In addition, the argon annealing of Comparative Example 5 and Example 7 where argon annealing is performed is a heat treatment at 1200° C. for 30 min under an argon gas atmosphere. Further, in the following descriptions, "heat treatment that corresponds to epitaxial layer growth conditions" is a heat treatment that is performed without material source gas being introduced inside the epitaxial device (CENTURA®, manufactured by Applied Materials, Inc.) and means a heat treatment at 1150° C. for 10 min under a hydrogen gas atmosphere.

Comparative Example 4

A heat treatment that corresponds to the epitaxial layer growth conditions is performed without performing argon annealing on the silicon wafer that is not doped with carbon (the heat treatment alone does not cause the silicon epitaxial layer to grow).

Comparative Example 5

Argon annealing is performed on a silicon wafer that is not doped with carbon, and a heat treatment that corresponds to the epitaxial layer growth conditions is performed.

Example 6

A heat treatment that corresponds to the epitaxial layer growth conditions is performed without performing argon annealing on a silicon wafer that is doped with carbon.

Example 7

Argon annealing is performed on a silicon wafer that is doped with carbon, and a heat treatment that corresponds to the epitaxial layer growth conditions is performed.

For each silicon wafer, presence of a slip dislocation observed on the wafer surface is checked by X-ray topography. As a result, as shown in FIG. 7, no slip dislocation was found in any of the silicon wafers and it was also found that slip dislocation does not occur even when a silicon wafer is densely doped with carbon.

[Verification of Resistivity, Carbon Concentration, and LPD Density]

For the following Comparative Examples 6 and 7 and Examples 8 and 9, in order to verify correlations between resistivity, carbon concentration, and LPD density, silicon wafers are manufactured under various conditions, an epitaxial layer is formed on the surface of each silicon wafer, and the LPD density observed on the surface of the epitaxial layers is measured. Moreover, the argon annealing of Comparative Example 7 and Example 9 below is a heat treatment at 1200° C. for 30 min under an argon gas atmosphere.

Comparative Example 6

Without performing carbon doping, phosphorus is doped such that the resistivity on the top end of the straight body of a single crystal ingot is 1.2 mΩ·cm and the single crystal ingot is grown with a resistivity range from 0.5 mΩ·cm to 1.2 mΩ·cm, and a plurality of silicon wafers with different resistivity are manufactured from the single crystal ingot. A silicon epitaxial layer with 4 μm thickness is formed without performing argon annealing on any of the silicon wafers.

Comparative Example 7

Similar to Comparative Example 6, carbon doping is not performed and a single crystal ingot is grown with a resistivity range from 0.5 mΩ·cm to 1.2 mΩ·cm, and a plurality of silicon wafers with different resistivity are manufactured from the single crystal ingot. Without performing carbon doping, an epitaxial layer with 4 μm thickness is formed after argon annealing is performed on each of the silicon wafers.

Example 8

Similar to Comparative Example 6, a single crystal ingot with a resistivity range from 0.5 mΩ·cm to 1.2 mΩ·cm is grown, and a plurality of silicon wafers with different resistivity were manufactured from the single crystal ingot. Carbon doping is performed such that the carbon concentration on the top end of the straight body of the single crystal ingot is $3.0 \times 10^{16}$ atoms/cm$^3$, however an epitaxial layer with 4 μm thickness is formed without performing argon annealing on any of the silicon wafers.

Example 9

Similar to Comparative Example 6, a single crystal ingot with a resistivity range from 0.5 mΩ·cm to 1.2 mΩ·cm is grown, and a plurality of silicon wafers with different resistivity were manufactured from the single crystal ingot. Carbon doping is performed such that the carbon concentration on the top end of the straight body of the single crystal ingot is $3.0 \times 10^{16}$ atoms/cm$^3$, and an epitaxial layer with 4 μm thickness is formed after performing argon annealing on each of the silicon wafers.

Figure 8:
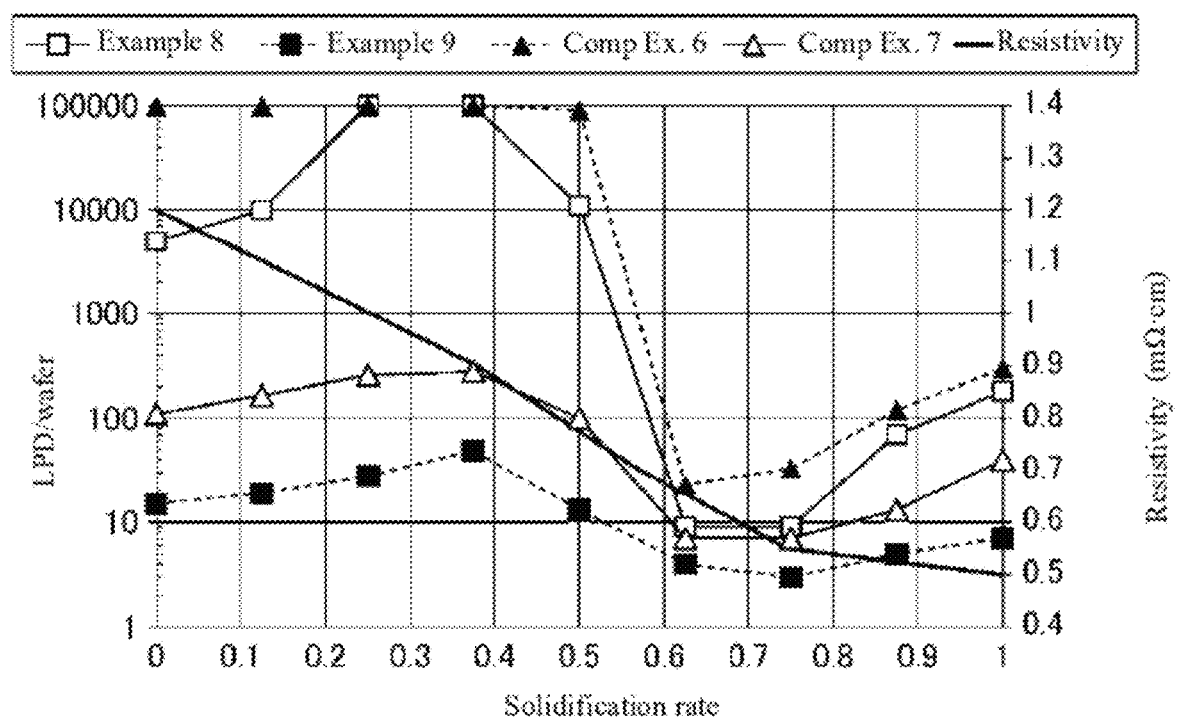
FIG. 8 is a graph illustrating a relationship between LPD density and resistivity when the epitaxial layer is formed on the surface of the respective silicon wafer in Examples 8 and 9 and Comparative Examples 6 and 7.

FIG. 8 is a graph for the epitaxial layer in Examples 8 and 9 and Comparative Examples 6 and 7 illustrating a relationship between the resistivity of a silicon wafer and the LPD density observed on the surface of an epitaxial layer. The horizontal axis in FIG. 8 shows, using a solidification rate of the straight body of an ingot, a position where the silicon wafer is cut when a solidification amount of the entire length of the straight body of the grown ingot is set as 1.

As shown in FIG. 8, in Example 8 in which carbon doping is performed and argon annealing is not performed prior to the epitaxial growth process, an LPD density of approximately 5,000 defects/wafer is observed in a silicon wafer that is cut from a position on the straight body of the ingot near the solidification rate of 0.1, which is the crystal region on the top side, confirming an effect of reducing the LPD density. However, the LPD density overflowed in a silicon wafer that is cut from a position on the straight body of the ingot near the solidification rate of 0.3. In addition, when the silicon wafer that is cut from a crystal region on a bottom side is used, the LPD density can be reduced to 150 defects/wafer or less even with a silicon wafer having an extreme resistivity of 0.5 mΩ·cm.

In Example 9, where carbon doping is performed and argon annealing is performed prior to the epitaxial growth process, the LPD density can be reduced to 60 defects/wafer or less even when a silicon wafer that is cut from the crystal region on the top side is used. This is due to refinement of dislocation loop defects achieved with highly concentrated carbon doping and due to eliminating refined dislocation loop defects by performing argon annealing on the silicon wafer, and the effect of reducing SF through a synergistic effect of highly concentrated carbon doping and argon annealing was found to be extremely significant. On the other hand, when a silicon wafer is used that is cut from the crystal region on the bottom side (where the solidification rate is 0.6 or more), which has a short residence time in an SF nucleation temperature zone, the LPD density can be reduced to a total of 10 defects/wafer or less.

On the other hand, in Comparative Example 6, where carbon doping is not performed and argon annealing is not performed on the silicon wafer, when a silicon wafer that is cut from the crystal region on the top side is used, the LPD density overflows, and although the LPD density is significantly reduced when a silicon wafer that is cut from the crystal region on the bottom side is used, the LPD density is 100 defects/wafer or more for a silicon wafer having resistivity of 0.5 mΩ·cm. Further, in Comparative Example 7, where carbon doping is not performed and argon annealing is performed on the silicon wafer prior to the epitaxial growth process, the LPD density can be reduced compared to Comparative Example 6. However, when a silicon wafer that is cut from the crystal region on the top side is used, the LPD density is from 100 defects/wafer to 300 defects/wafer.

Based on the above-noted results, by performing carbon doping of $3.0 \times 10^{16}$ atoms/cm$^3$ or more and by performing argon annealing on the silicon wafer prior to the epitaxial growth process, the LPD density observed on the surface of the epitaxial layer in all crystal regions of the single crystal ingot can be reduced to at least 100 defects/wafer. In addition, even when argon annealing is not performed on the silicon wafer, by performing carbon doping, the LPD density can be reduced to 100 defects/wafer or less in the crystal region on the bottom side. Although the present examples do not disclose all experimental examples that were developed, the inventors of the present invention found that, when highly concentrated carbon of at least $3.0 \times 10^{16}$ atoms/cm$^3$ or more is added, the LPD density after the epitaxial growth process can be reduced for a silicon wafer having resistivity from 0.5 mΩ·cm to 1.2 mΩ·cm as compared to a case where carbon is not added.

[Evaluation of Device Pressure Resisting Characteristics]

Device pressure resisting characteristics are evaluated. In this example, the device pressure resistance is one of the quality characteristics of a semiconductor device and means the voltage when a breakdown occurs by gradually increasing the voltage between a drain and a source in a state where a path between a gate and a source that configure the semiconductor device is short circuited.

When oxygen in the silicon wafer diffuses into the epitaxial layer where the semiconductor device is fabricated, there is a concern that the device pressure resisting characteristics may be affected. Because of this, the inventors of the present invention prepared silicon wafers with six different levels of oxygen concentration, formed a silicon epitaxial layer on each silicon wafer, and studied whether there is a difference in the device pressure resisting characteristics based on the difference in oxygen concentration. Further, studies were made as to whether there is a difference in the device pressure resisting characteristics based on whether the silicon wafer was doped with carbon.

Specifically, the semiconductor device is fabricated on each of the epitaxial silicon wafers in samples 1 to 12 in Table 1, a predetermined voltage is applied between the drain and source in a state where the path between the gate and the source that configure the semiconductor device is short circuited, and the pressure resisting characteristics were determined to be "poor" when breakdown occurred whereas the pressure resisting characteristics were determined to be "good" when breakdown did not occur.

The epitaxial silicon wafer in samples 1 to 6 is 200 mm in diameter, has had phosphorus added, and has a silicon epitaxial layer with 4 μm thickness formed on the silicon wafer having resistivity of 0.75 mΩ·cm, and is a sample wafer where the epitaxial layer is formed on each of the silicon wafers having six different levels of oxygen concentration and no carbon added. The epitaxial silicon wafer in samples 7-12 is, similar to samples 1 to 6, 200 mm in diameter, has had phosphorus added, and has a silicon epitaxial layer with 4 μm thickness formed on the silicon wafer having resistivity of 0.75 mΩ·cm, and is a sample wafer where the carbon concentration is $6.0 \times 10^{16}$ atoms/cm$^3$ and the epitaxial layer is formed on each of the silicon wafers having six different levels of oxygen concentration. The carbon concentration and oxygen concentration are each a value obtained by thinning the silicon wafer by polishing, and then measuring the concentration about the center of the silicon wafer in the depth direction using SIMS.

TABLE 1

| Epitaxial silicon wafer | Carbon concentration (atoms/cm$^3$) | Oxygen concentration (atoms/cm$^3$) | Pressure resisting characteristics |
|---|---|---|---|
| Sample 1 | Detection limit or less | $18 \times 10^{17}$ | Poor |
| Sample 2 | Detection limit or less | $15 \times 10^{17}$ | Good |
| Sample 3 | Detection limit or less | $13 \times 10^{17}$ | Good |
| Sample 4 | Detection limit or less | $10 \times 10^{17}$ | Good |
| Sample 5 | Detection limit or less | $8.0 \times 10^{17}$ | Good |
| Sample 6 | Detection limit or less | $4 \times 10^{17}$ | Good |
| Sample 7 | $6.0 \times 10^{16}$ | $18 \times 10^{17}$ | Poor |
| Sample 8 | $6.0 \times 10^{16}$ | $15 \times 10^{17}$ | Poor |
| Sample 9 | $6.0 \times 10^{16}$ | $13 \times 10^{17}$ | Poor |
| Sample 10 | $6.0 \times 10^{16}$ | $10 \times 10^{17}$ | Good |
| Sample 11 | $6.0 \times 10^{16}$ | $8.0 \times 10^{17}$ | Good |
| Sample 12 | $6.0 \times 10^{16}$ | $4.0 \times 10^{17}$ | Good |

As shown in Table 1, device pressure resistance in samples 7-9 is confirmed to likely be poor when carbon doping is performed. However, even when carbon doping is performed, it is confirmed that poor device pressure resistance can be prevented by configuring the oxygen concentration to $10 \times 10^{17}$ atoms/cm$^3$ or less.

It is noted that the foregoing examples have been provided merely for the purpose of explanation and are in no way to be construed as limiting of the present invention. While the present invention has been described with reference to exemplary embodiments, it is understood that the words that have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An epitaxial wafer of 200 mm in diameter comprising:
   a silicon substrate having a resistivity of 1.2 mΩ-cm or less;
   an epitaxial layer on the silicon substrate; and
   a boundary between the epitaxial layer and the silicon substrate;
   wherein
   the silicon substrate has a carbon concentration of $3.0 \times 10^{16}$ atoms/cm$^3$ or more at about a center of the silicon substrate in a depth direction; and
   wherein one of the following three conditions is satisfied:

(i) a carbon concentration in a region of the silicon substrate between the boundary and a position about 5 μm from the boundary is decreased by 10% or more compared with the carbon concentration at about the center of the silicon substrate in the depth direction, or (ii) wherein a carbon concentration in a region of the silicon substrate between the boundary and a position about 8 μm from the boundary is decreased by 10% or more compared with the carbon concentration at about the center of the silicon substrate in the depth direction, or (iii) wherein a carbon concentration in a region of the silicon substrate between the boundary and a position about 15 μm from the boundary is decreased by 10% or more compared with the carbon concentration at about the center of the silicon substrate in the depth direction.

2. The epitaxial wafer of claim 1 wherein the carbon concentration is in a range of $3.0\times10^{16}$ atoms/cm$^3$ to $5.0\times10^{17}$ atoms/cm$^3$.

3. The epitaxial wafer of claim 1 wherein a top surface of the epitaxial layer contains 100 or fewer light point defects (LPDs) of 0.09 μm or more in size.

4. The epitaxial wafer of claim 1 wherein a top surface of the epitaxial layer contains 60 or fewer LPDs of 0.09 μm or more in size.

5. The epitaxial wafer of claim 1 further comprising an oxygen concentration in the silicon substrate in a range of $4.0\times10^{17}$ atoms/cm$^3$ to $10\times10^{17}$ atoms/cm$^3$.

6. The epitaxial wafer of claim 1 wherein the resistivity of the silicon substrate is in a range of 0.5 mΩ-cm to 1.2 mΩ-cm.

7. The epitaxial wafer of claim 1 wherein the silicon substrate is substantially free of crystal-originated particles.

8. An epitaxial wafer of 200 mm in diameter comprising:
a silicon substrate having a resistivity of 1.2 mΩ-cm or less, and a carbon concentration of $3.0\times10^{16}$ atoms/cm$^3$ or more at about a center of the silicon substrate in a depth direction;
an epitaxial layer on the silicon substrate; and
a boundary between the epitaxial layer and the silicon substrate;
wherein the silicon substrate further has a low carbon concentration layer near the boundary; and
wherein one of the following three conditions is satisfied:
(i) the low carbon concentration layer in the silicon substrate is within about 5 μm of the boundary, and a carbon concentration in the low carbon concentration layer is decreased by 10% or more compared with the carbon concentration at about the center of the silicon substrate in the depth direction, or
(ii) the low carbon concentration layer in the silicon substrate is within about 8 μm of the boundary, and a carbon concentration in the low carbon concentration layer is decreased by 10% or more compared with the carbon concentration at about the center of the silicon substrate in the depth direction, or
(iii) the low carbon concentration layer in the silicon substrate is within about 15 μm of the boundary, and a carbon concentration in the low carbon concentration layer is decreased by 10% or more compared with the carbon concentration at about the center of the silicon substrate in the depth direction.

9. The epitaxial wafer of claim 8 wherein the carbon concentration is in a range of $3.0\times10^{16}$ atoms/cm$^3$ to $5.0\times10^{17}$ atoms/cm$^3$.

10. The epitaxial wafer of claim 8 wherein a top surface of the epitaxial layer contains 100 or fewer light point defects (LPDs) of 0.09 μm or more in size.

11. The epitaxial wafer of claim 8 wherein a top surface of the epitaxial layer contains 60 or fewer LPDs of 0.09 μm or more in size.

12. The epitaxial wafer of claim 8 further comprising an oxygen concentration in the silicon substrate in a range of $4.0\times10^{17}$ atoms/cm$^3$ to $10\times10^{17}$ atoms/cm$^3$.

13. The epitaxial wafer of claim 8 wherein the resistivity of the silicon substrate is in a range of 0.5 mΩ-cm to 1.2 mΩ-cm.

14. The epitaxial wafer of claim 8 wherein the silicon substrate is substantially free of crystal-originated particles.

15. A silicon wafer having a diameter of 200 mm, a resistivity of 1.2 mΩ-cm or less, and a carbon concentration of $3.0\times1016$ atoms/cm$^3$ or more at about a center of the silicon wafer in a depth direction;
wherein
the silicon wafer has a top surface, and
at least one of the following three conditions are satisfied:
(i) a carbon concentration in a region of the silicon wafer between the top surface and a position about 5 μm from the top surface is decreased by 10% or more compared with the carbon concentration at about the center of the silicon wafer in the depth direction, or
(ii) a carbon concentration in a region of the silicon wafer between the top surface and a position about 8 μm from the top surface is decreased by 10% or more compared with the carbon concentration at about the center of the silicon wafer in the depth direction, or
(iii) a carbon concentration in a region of the silicon wafer between the top surface and a position about 15 μm from the top surface is decreased by 10% or more compared with the carbon concentration at about the center of the silicon wafer in the depth direction.

16. The silicon wafer of claim 15 wherein the carbon concentration is in a range of $3.0\times10^{16}$ atoms/cm$^3$ to $5.0\times10^{17}$ atoms/cm$^3$.

17. The silicon wafer of claim 15 further comprising an oxygen concentration in a range of $4.0\times10^{17}$ atoms/cm$^3$ to $10\times10^{17}$ atoms/cm$^3$.

18. The silicon wafer of claim 15 wherein the resistivity of the silicon wafer is in a range of 0.5 mΩ-cm to 1.2 mΩ-cm.

19. The silicon wafer of claim 15 wherein the silicon wafer is substantially free of crystal-originated particles.

20. An epitaxial wafer of 200 mm in diameter comprising:
a silicon substrate having a resistivity of 1.2 mΩ-cm or less;
an epitaxial layer on top of the silicon substrate; and
a boundary between the epitaxial layer and the silicon substrate;
wherein
a carbon concentration in the silicon substrate is $3.0\times10^{16}$ atoms/cm$^3$ or more at about a center of the silicon substrate in a depth direction, and
a carbon concentration in a region of the silicon substrate between the boundary and a position about 5 μm to 15 μm from the boundary is decreased by 10% or more compared with the carbon concentration at about the center of the silicon substrate in the depth direction.

21. The epitaxial wafer of claim 20 wherein the carbon concentration is in a range of $3.0\times10^{16}$ atoms/cm$^3$ to $5.0\times10^{17}$ atoms/cm$^3$.

22. The epitaxial wafer of claim 20 wherein a top surface of the epitaxial layer has 100 or less LPDs of 0.09 μm or more in size.

23. The epitaxial wafer of claim 20 further comprising an oxygen concentration in the silicon substrate in a range of $4.0 \times 10^{17}$ atoms/cm$^3$ to $10 \times 10^{17}$ atoms/cm$^3$.

24. The epitaxial wafer of claim 20 wherein the silicon substrate has a top surface and a bottom surface and the resistivity of 1.2 mΩ-cm or less is measured from either the top surface or the bottom surface.

25. A silicon wafer of 200 mm in diameter doped with phosphorus and having a resistivity of 1.2 mΩ-cm or less,
   the silicon wafer comprising a top surface and a bottom surface;
   wherein a carbon concentration in the silicon wafer is $3.0 \times 10^{16}$ atoms/cm$^3$ or more at about a center of the silicon wafer in a depth direction, and
   a carbon concentration in a region of the silicon wafer between the top surface and a position about 5 μm to 15 μm from the top surface is decreased by 10% or more compared with the carbon concentration at about the center of the silicon wafer in the depth direction.

26. The silicon wafer of claim 25 wherein the carbon concentration is in a range of $3.0 \times 10^{16}$ atoms/cm$^3$ to $5.0 \times 10^{17}$ atoms/cm$^3$.

27. The silicon wafer of claim 25 further comprising an oxygen concentration in a range of $4.0 \times 10^{17}$ atoms/cm$^3$ to $10 \times 10^{17}$ atoms/cm$^3$.

28. The silicon wafer of claim 25 wherein the resistivity of 1.2 mΩ-cm or less is measured from either the top surface or the bottom surface.

29. A method of making an epitaxial wafer of 200 mm in diameter, comprising:
   placing a crucible in a furnace;
   adding phosphorus and carbon to a silicon melt in the crucible;
   rotationally pulling a single crystal from the silicon melt with a puller;
   cutting the single crystal to form at least one silicon wafer;
   heating the silicon wafer at a temperature between 1150° C. to 1250° C. in an atmosphere charged with argon gas for a duration between 30 to 120 minutes; and
   forming an epitaxial layer on a surface of the silicon wafer, wherein the silicon wafer has a carbon concentration of $3.0 \times 10^{16}$ atoms/cm$^3$ or more at about a center of the silicon wafer in a depth direction therein, and
   wherein one of the following three conditions is satisfied:
   (i) a carbon concentration in a region of the silicon wafer between a boundary between the silicon wafer and the epitaxial layer and a position about 5 μm from the boundary is decreased by 10% or more compared with the carbon concentration at about the center of the silicon wafer in the depth direction, or
   (ii) a carbon concentration in a region of the silicon wafer between the boundary and a position about 8 μm from the boundary is decreased by 10% or more compared with the carbon concentration at about the center of the silicon wafer in the depth direction, or
   (iii) a carbon concentration in a region of the silicon wafer between the boundary and a position about 15 μm from the boundary is decreased by 10% or more compared with the carbon concentration at about the center of the silicon wafer in the depth direction.

30. The method of claim 29 further comprising applying magnetic field to the silicon melt and controlling pressure in the furnace so that the silicon wafer has an oxygen concentration between $4.0 \times 10^{17}$ atoms/cm$^3$ to $10 \times 10^{17}$ atoms/cm$^3$.

31. The method of claim 30 wherein the oxygen concentration is measured from about halfway in the depth direction of the silicon wafer.

32. The method of claim 29 wherein the silicon wafer has a resistivity of 1.2 mΩ·cm or less.

* * * * *